United States Patent [19]

Irikawa

[11] Patent Number: 5,521,935
[45] Date of Patent: May 28, 1996

[54] STRAINED SUPERLATTICE LIGHT EMITTING DEVICE

[75] Inventor: Michinori Irikawa, Yokohama, Japan

[73] Assignee: The Furukawa Electric Co., Ltd., Tokyo, Japan

[21] Appl. No.: 364,283

[22] Filed: Dec. 27, 1994

[30] Foreign Application Priority Data

Dec. 27, 1993 [JP] Japan .................. 5-350722

[51] Int. Cl.$^6$ .................................................. H01S 3/19
[52] U.S. Cl. ................... 372/45; 257/18; 257/21
[58] Field of Search .................. 372/45, 46; 257/12, 257/18, 21

[56] References Cited

U.S. PATENT DOCUMENTS 5,396,508  3/1995  Bour et al. .................. 372/45

OTHER PUBLICATIONS

Okamoto, M. et al. "TM Mode Gain Enhancement in GaInAs–InP Lasers with Tensile Strained–layer Superlattice", IEEE Journal of Quantum Electronics, vol. 27, No. 6, Jun. 1991, p.

Xu, C. et al, "Polarization–insensitive Travelling–wave Semi–conductor Optical Amplifier With A Square–shaped Active Waveguide", Optical Amplifiers and Their Applications, 1992 Technical Digest Series vol. 17, Jun. 24–26, 1992.

Primary Examiner—Rodney B. Bovernick
Assistant Examiner—Yisun Song
Attorney, Agent, or Firm—Jacobson, Price, Holman & Stern

[57] ABSTRACT

There is provided a strained superlattice light emitting device for emitting light with a wavelength band around 0.8 μm that is free from polarization dependency or can emit light either in the TE or TM mode with an output level much higher than that of an ordinary bulk layer, regardless of the density of injected current or carriers. Such a device comprises an InP substrate 1 and a pair of latticematched cladding layers 2 and 6 arranged on the substrate 1 and including first and second conductive type Al(Ga) InAs layers and an active layer 4 sandwiched by the pair of cladding layers 2 and 6 and having a strained superlattice structure, wherein the well layers 4a and 4b of the active layer 4 strained superlattice structure are respectively a GaInAsP layer showing an inplane tensile strain of 0.3 to 3% relative to the substrate and a GaInAsP layer showing an in-plane compressive strain of 0.3 to 3% relative to the substrate and the barrier layer 4b of the strained superlattice structure comprises an AlGaInAs layer.

2 Claims, 3 Drawing Sheets

STRAINED SUPERLATTICE LIGHT EMITTING DEVICE

BACKGROUND OF THE INVENTION

1. Field of the Invention

This invention relates to a strained superlattice light emitting device and, more particularly, it relates to a superluminescent diode having a wavelength band around 0.8µm with a controlled plane of polarization.

Prior Art

Superluminescent diodes (hereinafter referred to as SLDs) are classified between semiconductor laser devices and light emitting diodes and have been attracting attention in recent years. Such a light emitting device shows an incoherent and wide light emitting spectrum like a light emitting diode and, at the same time, can emit highly directional light with an enhanced output level like a semiconductor laser device.

In order to use an SLD, it is necessary to effectively control the polarization dependency of the output light of the device.

There has been discussed the application of a technique developed for strained superlattice structures to the control of polarization related properties of SLDs having a wide wavelength band between 1.3 and 1.55µm. The technique is based on the phenomenon that, when a superlattice structure is subjected to bidirectional strain, it comes to show a modified vallence band structure. The gain for the TE mode which relates to heavy holes increases relatively, if the applied strain is compressive, whereas the gain for the TM mode which relates to increases relatively light holes, if the strain is tensile.

Meanwhile, known techniques for manufacturing SLDs and superlattice optical amplifiers capable of producing polarization independent light include the following:

1) The use of a multiple quantum well structure for the active layer, strain free GaInAs for the well layer and GaInAs with in-plane tensile strain for the barrier layer in an SLD (See Paper No. 1 listed below).

A proposed theory explaining the mechanism of achieving polarization independency by this technique is as follows:

A barrier layer that is tensile strained by approximately 2% shows a valence band energy level for holes lower than that of a strain free well layer. This by turn increases the concentration of holes within the barrier layer. Since these holes are mostly light holes, the rate at which electrons and light holes are recombined to emit light in the TM mode is increased. On the other hand, since holes within the well layer behave as heavy holes, they are mostly active for emitting light in the TE mode. This well balanced activities of holes in the emission of light provides the basis for achieving polarization independency of the output of the SLD.

2) Generation of an appropriate degree of tensile strain in the well layer of the multiple quantum well structure of an optical amplifier (See Paper No. 2 listed below).

According to a proposed theory explaining the mechanism of achieving polarization independency by this technique, holes in a strain free well layer are normally heavy holes that are mostly active for emitting light in the TE mode. As the well layer is tensile strained, the energy level of light holes is lowered to increase the concentration of holes within the light hole band. Since light holes are mostly active for the emission of light in the TM mode, the intensity of light emitted in the TE mode and that of light emitted in the TM mode can be balanced to realize polarization independency of the output of the optical amplifier.

Paper No. 1: IEEE J: Quantum Electron., vol.127, pp. 1463, 1991.

Paper No. 2: Optical Fiber Topical Meeting FA3, 1992.

[Problems to be Solved by the Invention]

However, known techniques including the above are accompanied by the following problems if they are used to achieve polarization independency of the output of devices of the type under consideration.

1) If the first one of the above listed techniques is used for a 0.85 µm band on a GaAs substrate of a device of the type under consideration, the wavelength of light emitted from the strain free GaAs well layer is shifted to become shorter by the quantum confining effect of the device, which consequently can no longer emit light with a same wavelength of 0.85 µm. This phenomenon is particularly disadvantageous because it can alter the branching effect of the fiber coupler.

2) If the density of injected current or that of injected carriers goes out of a predetermined range with the second technique, heavy and light holes come to show a change in the distribution pattern. This in turn produces a lopsided relationship in the intensity of light emitted in the TE mode and in the TM mode to raise the polarization dependency of the output.

In view of the above identified problems, it is therefore an object of the present invention to provide a strained superlattice light emitting device which is of polarization independency, regardless of the density of injected current or that of injected carriers or which shows an intensity of light emitted either in the TE or TM mode by far greater than that of light emitted form an ordinary bulk active layer.

SUMMARY OF THE INVENTION

According to a first aspect of the invention, the above problems are solved by providing a strained superlattice light emitting device comprising an InP substrate and a pair of latticematched cladding layers arranged on said substrate and including first and second conductive type Al(Ga) InAs layers and an active layer sandwiched by said pair of cladding layers and having a strained superlattice structure, characterized in that the well layer of the strained superlattice structure comprises a GaInAsP layer showing an in-plane tensile strain of 0.3 to 3% relative to the substrate and a GaInAsP layer showing an in-plane compressive strain of 0.3 to 1% relative to the substrate and the barrier layer of the strained superlattice structure comprises an AlGaInAs layer.

According to a second aspect of the invention, there is provided a strained superlattice light emitting device of the type as defined by the preamble of the above description relating to the first aspect of the invention, characterized in that the well layer of the strained superlattice structure comprises a GaInAsP layer showing an in-plane tensile strain of 0 to 3% or an in-plane compressive strain of 0.3 to 1% relative to the substrate and the barrier layer comprises an Al(Ga)InAs layer showing an in-plane tensile or compressive strain of 0 to 0.4% relative to the substrate.

According to a third aspect of the invention, there is provided a strained superlattice light emitting device comprising a GaAs substrate and a pair of lattice-matched cladding layers arranged on said substrate and including first and second conductive type GaIn(As)P layers and an active layer sandwiched by said pair of cladding layers and having a strained superlattice structure, characterized in that the well layer of the strained superlattice structure comprises an InGaAs(P) layer showing an in-plane compressive strain relative to the substrate and the barrier layer of the strained superlattice structure comprises an Ga(In)AsP layer showing an in-plane tensile strain.

Note that the elements in the above parentheses denote respective elements that may or may not exist.

[Function]

According to the first aspect of the invention, since the well layer of the active layer comprises a first well GaInAsP well layer showing an in-plane tensile strain of 0.3 to 3% relative to the InP substrate and a second GaInAsP well layer showing an in-plane compressive strain of 0.3 to 1% relative to the InP substrate, the first well layer mainly emits light in the TE mode whereas the second well layer mainly emits light in the TM mode so that the light emission performance of the device is mostly independent of the plane of polarization.

Since the well layer of the active layer comprises a GaInAsP layer showing an in-plane tensile strain of 0 to 3% or an in-plane compressive strain of 0.3 to 1% relative to the InP substrate and the barrier layer comprises an AlGaInAs layer showing an in-plane tensile or compressive strain of 0 to 0.4% relative to the InP substrate in a device according to the second aspect of the invention, the device shows a polarization dependency that is stronger in the TM mode than in the TE mode or vice versa.

Finally, since the well layer of the active layer comprises an InGaAs(P) layer having an in-plane compressive strain relative to the GaAs substrate while the barrier layer of the active layer comprises a Ga(In)AsP layer having an in-plane tensile strain relative to the GaAs substrate in a device according to the third aspect of the invention, the polarization dependency of the device is strongly lopsided in favor of the TE mode.

The numerical limit values cited above for the purpose of the present invention are based on the critical film thickness of superlattice structure. In order to have a light emitting device showing a wavelength contained within a desire range, the material of the well layer of the superlattice structure has to be selected by referring to the relationship between the lattice constant and the energy gap of semiconductors of III–V group compounds as illustrated in FIG. 4 of the accompanying drawings.

DETAILED DESCRIPTION OF THE PREFERRED EMBODIMENTS

Now, the present invention will be described in greater detail by referring to the accompanying drawings that illustrate preferred embodiment of the invention.

[Embodiment 1]

Figure 1:
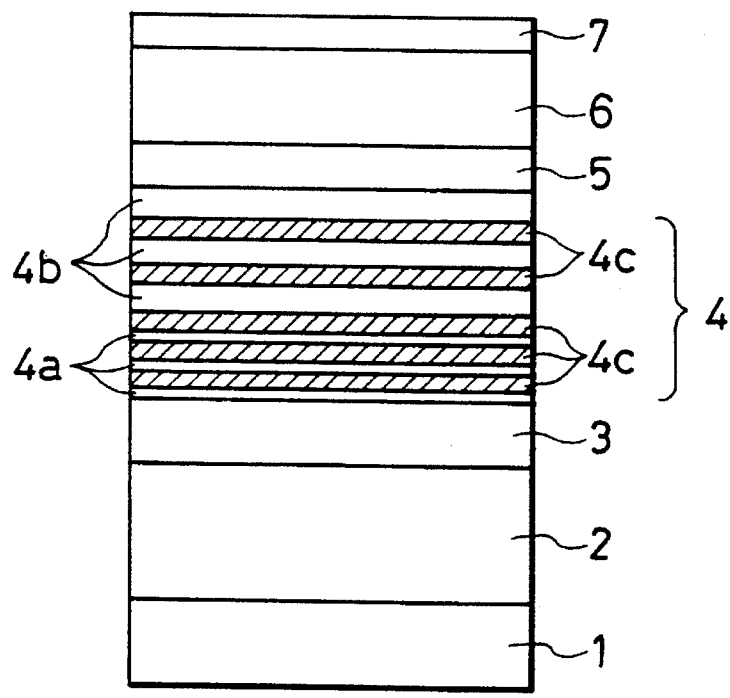
FIG. 1 is a schematic sectional view of a first embodiment of strained superlattice superluminescent diode according to the invention.

FIG. 1 is a schematic sectional view of a first embodiment of strained superlattice SLD according to the invention.

Referring to FIG. 1, the embodiment comprises an n-InP substrate 1 and a cladding layer 2 made of n-AlInAs that is latticematched with said substrate 1, an n-AlGaInAs light confining layer 3, a multiple quantum well structure 4, a p-AlGaInAs light confining layer 5, a p-AlInAs cladding layer 6 and a p-GaInAs cap layer 7 arranged sequentially on the substrate 1 in the described order to form a multilayer structure. The multiple quantum well structure 4 comprises a pair of well layers of a GaInAsP well layer 4a with a 0.3% compressive strain (Eg=1.2 eV) and a GaInAsP well layer 4b (Eg=1.35 eV) with a 0.6% tensile strain and an AlGaInAs barrier layer 4c (Eg=1.6 eV) with a 0.3% tensile strain.

In this embodiment, the first well layer 4a emits light mostly in the TE mode while the second well layer 4b emits light mostly in the TM mode so that the device as a whole emits light without showing any dependency on the plane of polarization. Additionally, because the compressive strain of the well layer 4a compensates the tensile strain of the well layer 4b, the overall strained superlattice structure of the embodiment can be made much thicker than that of a device comprising a well layer only with either compressive or tensile strain in order to realize an enhanced output level of emission of light.

If the well layers 4a and 4b of the embodiment are approximately 4 nm and 100 nm wide respectively, it emit light having a wavelength of 0.85 μm. By intentionally altering the widths of the well layers 4a and 4b, a wider spectrum can be realized for emitted light to make the SLD more attractive.

In order to realize a wavelength band around 0.85 um for the embodiment, the well layer 4a may be made of GaInAsP (Eg=1.0 to 1.2 eV) having a compressive strain of 0.3 to 1.0% (preferably 0.3 to 0.6%), whereas the well layer 4b may be made of GaInAsP (Eg=1.30 to 1.35 eV) having a tensile strain of 0.3 to 3.0%. As for the barrier layer 4c, a requirement of Eg≧1.6 eV is preferably met.

The well layers 4a and 4b and the barrier layer 4c may alternatively be made of AlGaAsSb type and AlGaInAs type materials respectively that meet the above requirements for lattice constant and Eg.

[Embodiment 2]

Figure 2:
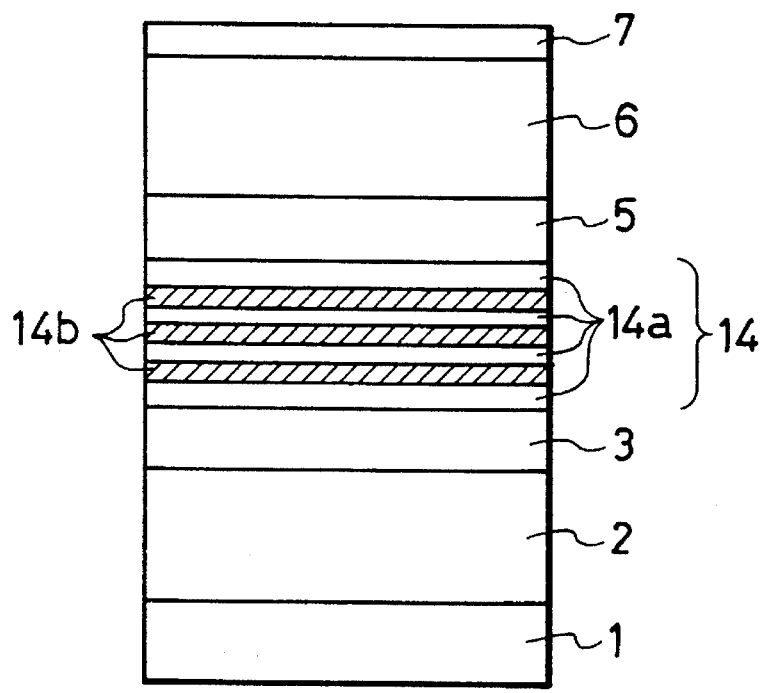
FIG. 2 is a schematic sectional view of a second embodiment of strained superlattice superluminescent diode according to the invention.

FIG. 2 is a schematic sectional view of a second embodiment of strained superlattice SLD according to the invention.

As seen from FIG. 2, the overall configuration of the embodiment is similar to that of the first embodiment except multiplequantum well structure 14. The multiple quantum well structure 14 of this embodiment comprises a pair of well layers of a GaInAsP well layer 14a with a 0 to 3.0% tensile strain (Eg=1.3 to 1.35 eV) and an AlGaInAs barrier layer 14b (Eg=1.47 to 1.6 eV) with a −0.4 to +0.3% tensile strain.

As the GaInAsP well layer 14a of this embodiment is tensile strained, it shows a polarization dependency that is stronger in the TM mode than in the TE mode. If, conversely, the GaInAsP well layer 14a of the embodiment is compressive strained, it shows a polarization dependency that is stronger in the TE mode than in the TM mode.

[Embodiment 3]

Figure 3:
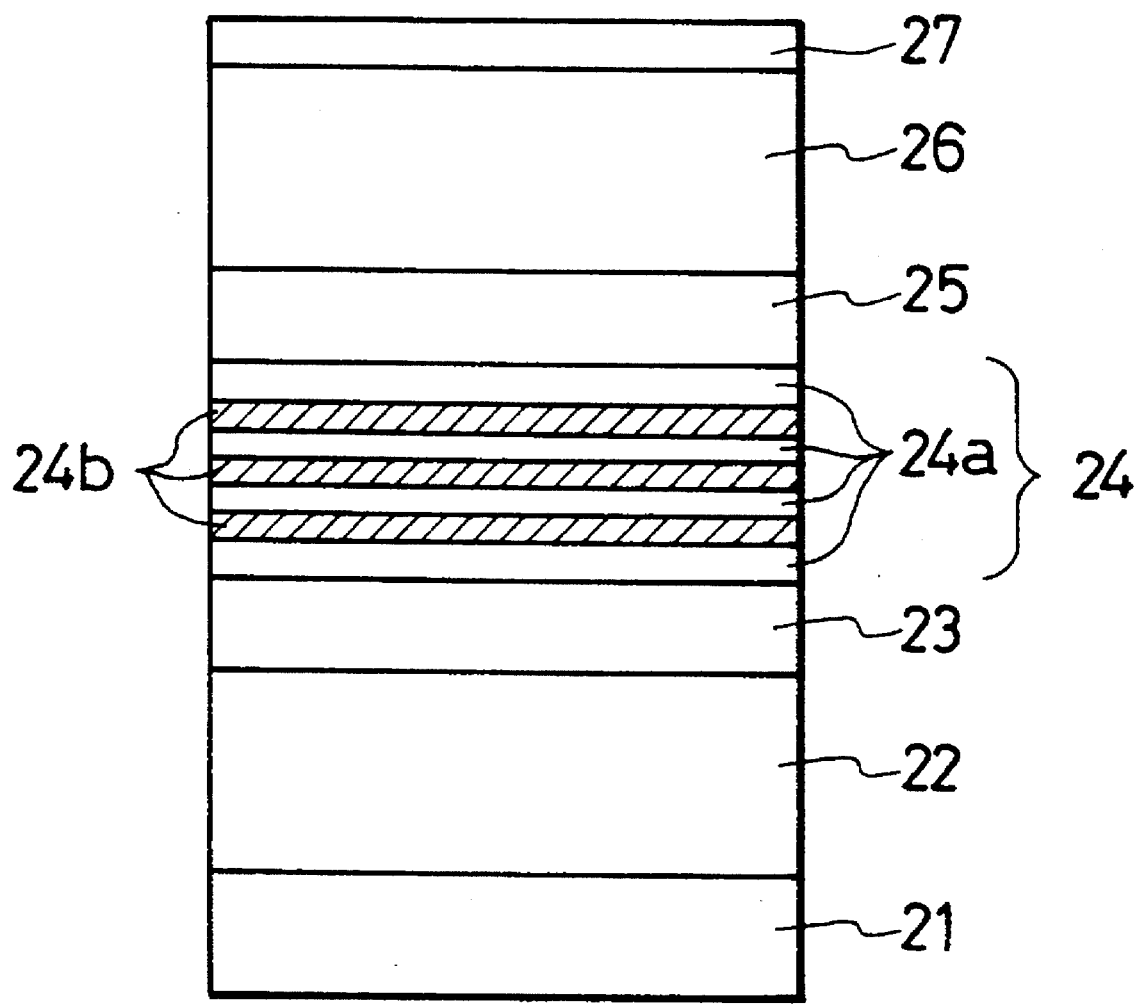
FIG. 3 is a schematic sectional view of a third embodiment of strained superlattice superluminescent diode according to the invention.
Figure 4:
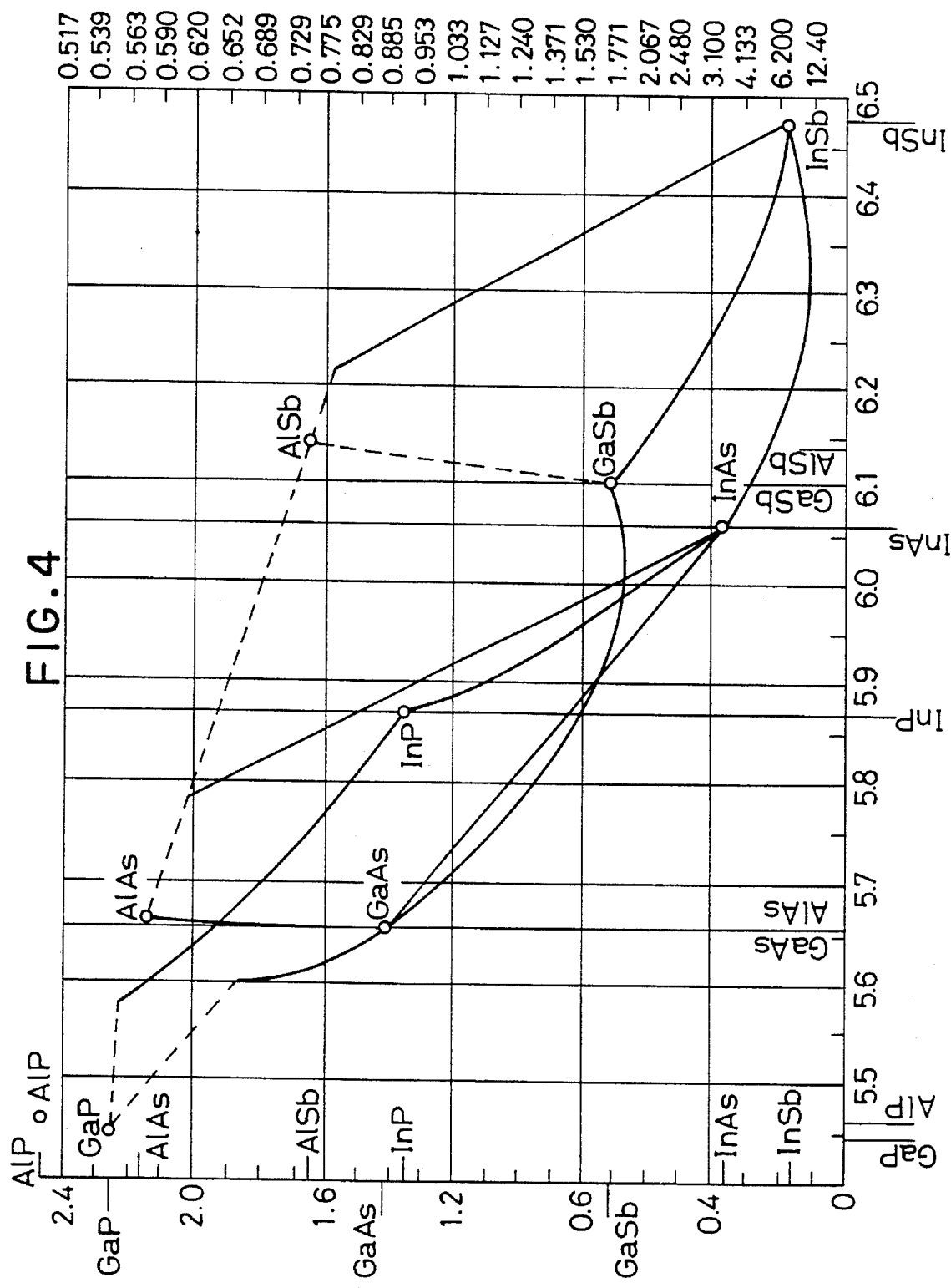
FIG. 4 is a graph showing the relationship between the lattice constant and the energy gap of semiconductors of III–V group compounds.

FIG. 3 is a schematic sectional view of a third embodiment of strained superlattice SLD according to the invention.

Referring to FIG. 3, the embodiment comprises an n-GaAs substrate 21, a cladding layer 22 made of n-GaInP that is latticematched with said substrate 21, an n-GaInAsP light confining layer 23, a multiple quantum well structure 24, a p-GaInAsP light confining layer 25, a p-GaInP cladding layer 26 and a p-GaAs cap layer 27 arranged sequentially on the substrate 21 in the described order to form a multilayer structure. The multiple quantum well structure 24 comprises an InGaAs well layer 24a with a 0.7% compressive strain (Eg=1.3 eV) and a GaAsP barrier layer 24b (Eg=1.6 GeV) with a 0.6% tensile strain.

In this embodiment, since the well layer 24a is strained by compression, it shows a polarization dependency that is more intensified in the TE mode relative to the TM mode than that of an ordinary bulk active layer. Additionally, because the compressive strain of the well layer 24a compensates the tensile strain of the barrier layer 24b, the overall strained superlattice structure of the embodiment can be made much thicker than that of a device comprising a well layer only with either compressive or tensile strain in order to realize an enhanced output level of emission of light.

For this embodiment, the well layer 24a is not necessarily made of InGaAs and InGaAsP may alternatively be used, if the requirement of Eg=1.1 to 1.3 eV is satisfied. Similarly, the barrier layer 24b may alternatively be made of InGaAsP showing a tensile strain of 0 to 1.0% if the requirement of Eg=1.6 eV is met. Additionally, the light confining layer 24 and 25 may alternatively be made of InGaAsP that is latticematched with GaAs if the requirement of Eg≧1.6 eV is satisfied.

It should be noted that the well layers of the above embodiments are nondoped, they may alternatively be p- or n-doped to an extent of $5 \times 10^{17}$ to $1 \times 10^{18} cm^{-3}$.

While the above embodiments are described in terms of a wavelength band around 0.85 μm for light emission, other wavelength bands may alternatively used for the purpose of the invention.

[Advantages of the Invention]

As described above in detail, a strained superlattice light emitting device or, more specifically, a superluminescent diode having a wavelength band around 0.8 μm according to the invention and comprising an active layer having a superlattice structure can be effectively controlled for the polarization dependency of output. Thus, it provides advantages including the following:

1) Because polarization independency is achieved, if a device of the type under consideration is conventionally combined with a depolarizer, the use of a depolarizer is no longer necessary for a device according to the invention.

2) The output level of the TE or TM polarized component can be remarkably raised relative that of the component perpendicular to the above component, if a device of the type under consideration is conventionally combined with a polarizer, the ineffective component of the output light can be significantly reduced to economize the overall power consumption.

3) Because of a multiple quantum well structure of the active layer of a device according to the invention, the spectrum width can be varied to a large extent by slightly chancing the widths of the well layers.

4) By using a strained quantum structure having compressive and tensile strains in combination for the quantum well structure, the overall film thickness of the active layer of a device according to the invention can be made significantly thick to achieve an enhanced output level.

What is claimed is:

1. A strained superlattice light emitting device comprising an InP substrate and a pair of lattice-matched cladding layers arranged on said substrate and including first and second conductive type Al(Ga)InAs layers and an active layer sandwiched by said pair of cladding layers and having a strained superlattice structure, characterized in that the well layer of the strained superlattice structure comprises a GaInAsP layer having an in-plane tensile strain of 0.3 to 3% relative to the substrate and a GaInAsP layer having an in-plane compressive strain of 0.3 to 1% relative to the substrate and the barrier layer of the strained superlattice structure comprising an AlGaInAs layer, and wherein the band gap of the well layer of the strained superlattice structure is between 1.2 and 1.35 eV (bulk value), if it has an in-plane tensile strain, and between 1.1 and 1.2 eV (bulk value), if it has an in-plane compressive strain.

2. A strained superlattice light emitting device comprising an InP substrate and a pair of lattice-matched cladding layers arranged on said substrate and including first and second conductive type Al(Ga)InAs layers and an active layer sandwiched by said pair of cladding layers and having a strained superlattice structure, characterized in that the well layer of the strained superlattice structure comprises a GaInAsP layer having an in-plane tensile strain of 0 to 3% or an in-plane compressive strain of 0.3 to 1% relative to the substrate and the barrier layer comprises an Al(Ga)InAs layer having an in-plane tensile or compressive strain of 0 to 0.4% relative to the substrate, and wherein the band gap of the well layer of the strained superlattice structure is between 1.2 and 1.35 eV (bulk value), if it has an in-plane tensile strain, and between 1.1 and 1.2 eV (bulk value), if it has an in-plane compressive strain.

* * * * *